United States Patent
Krames et al.

(10) Patent No.: US 8,334,155 B2
(45) Date of Patent: Dec. 18, 2012

(54) SUBSTRATE FOR GROWING A III-V LIGHT EMITTING DEVICE

(75) Inventors: Michael R. Krames, Mountain View, CA (US); Nathan F. Gardner, Sunnyvale, CA (US); John E. Epler, Milpitas, CA (US)

(73) Assignee: Philips Lumileds Lighting Company LLC, San Jose, CA (US)

( * ) Notice: Subject to any disclaimer, the term of this patent is extended or adjusted under 35 U.S.C. 154(b) by 304 days.

(21) Appl. No.: 11/237,164

(22) Filed: Sep. 27, 2005

(65) Prior Publication Data

US 2007/0072324 A1  Mar. 29, 2007

(51) Int. Cl.
 *H01L 21/00*   (2006.01)
 *H01L 21/20*   (2006.01)
 *H01L 21/36*   (2006.01)

(52) U.S. Cl. ............ 438/41; 438/46; 438/48; 438/478

(58) Field of Classification Search ............... 438/46, 438/497, 487, 478, 692, 455, 493, 938, 256, 438/26, 37, 39, 47, 489, 41, 22, 933, 48; 257/E33.032, E33.034, E21.088, E21.124, 257/E21.126; 117/84, 88
See application file for complete search history.

(56) References Cited

U.S. PATENT DOCUMENTS

| | | | |
|---|---|---|---|
| 5,466,631 A * | 11/1995 | Ichikawa et al. ............... 438/406 |
| 5,880,491 A | 3/1999 | Soref et al. |
| 6,194,742 B1 * | 2/2001 | Kern et al. ............... 372/45.011 |
| 6,316,785 B1 * | 11/2001 | Nunoue et al. ............... 257/14 |
| 6,362,496 B1 | 3/2002 | Nanishi et al. |
| 6,372,609 B1 | 4/2002 | Aga et al. |
| 6,380,108 B1 * | 4/2002 | Linthicum et al. ............ 438/791 |
| 7,125,734 B2 | 10/2006 | Sackrison et al. |
| 7,179,670 B2 * | 2/2007 | Shelton et al. ............... 438/26 |
| 7,256,483 B2 | 8/2007 | Epler et al. |
| 7,417,220 B2 * | 8/2008 | Suehiro et al. ............... 250/239 |
| 2002/0171091 A1 * | 11/2002 | Goetz et al. ............... 257/103 |
| 2002/0171092 A1 * | 11/2002 | Goetz et al. ............... 257/103 |
| 2003/0064535 A1 | 4/2003 | Kub et al. |
| 2004/0056254 A1 | 3/2004 | Bader et al. |
| 2005/0026394 A1 * | 2/2005 | Letertre et al. ............... 438/459 |

(Continued)

FOREIGN PATENT DOCUMENTS

WO  03105219 A1  12/2003

OTHER PUBLICATIONS

Soitec, web page downloaded on Apr. 7, 2005 from http://www.soitec.com/en/techno/t_2.htm, 1 page.

(Continued)

*Primary Examiner* — Chuong A. Luu

(57) ABSTRACT

A substrate including a host and a seed layer bonded to the host is provided, then a semiconductor structure including a light emitting layer disposed between an n-type region and a p-type region is grown on the seed layer. In some embodiments, a bonding layer bonds the host to the seed layer. The seed layer may be thinner than a critical thickness for relaxation of strain in the semiconductor structure, such that strain in the semiconductor structure is relieved by dislocations formed in the seed layer, or by gliding between the seed layer and the bonding layer an interface between the two layers. In some embodiments, the host may be separated from the semiconductor structure and seed layer by etching away the bonding layer.

21 Claims, 4 Drawing Sheets

U.S. PATENT DOCUMENTS

| | | |
|---|---|---|
| 2005/0098791 A1 | 5/2005 | Goto et al. |
| 2005/0224824 A1 | 10/2005 | Kim et al. |
| 2007/0069225 A1 | 3/2007 | Krames et al. |
| 2010/0041170 A1* | 2/2010 | Epler et al. ............ 438/26 |

OTHER PUBLICATIONS

M. Stutzmann et al., "Playing with Polarity," phys. stat. sol. (b) 228, No. 2, (2001), pp. 505-512.

J.L. Weyher et al., "Morphological and structural characteristics of homoepitaxial GaN grown by metalorganic chemical vapour deposition (MOCVD)," Journal of Crystal Growth, 204 (1999), pp. 419-428.

D. Zubia et al, "Nanoheteroepitaxial Growth of GaN on Si by Organometallic Vapor Phase Epitaxy", Applied Physics Letters, vol. 76, No. 7, Feb. 14, 2000, p. 858-860.

L.S. Wang et al, "InGaN/GaN Multi-quantum-well Structures on (111)-oriented Bonded Silicon-on-insulator Substrates", Applied Physics Letters, vol. 87, No. 11, Sep. 8, 2005, pp. 111908-111980-3.

J. Cao et al, "Improved Quality GaN by Browth onCompliant Silicon-on-insulator Substrates Using Metalorganic Chemical Vapor Deposition", Journal of Applied Physics, vol. 83, No. 7, Apr. 1, 1998, pp. 3829-3834.

Y. Dikme et al, "Growth and Characterization of GaN-based Structures on SiCOI-engineered Substrates", Journal of Crystal Growth, vol. 272, No. 1-4, Dec. 10, 2004, pp. 500-505.

A. Tauzin et al, Transfers of 2-inch GaN Films onto Sapphire Substrates Using Smart Cut™ Technology, Electronics Letters, vol. 41, No. 11, May 26, 2005, pp. 668-670.

* cited by examiner

SUBSTRATE FOR GROWING A III-V LIGHT EMITTING DEVICE

BACKGROUND

1. Field of Invention

This invention relates to semiconductor light emitting devices such as light emitting diodes and, in particular, to growth substrates on which such light emitting devices may be grown.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

Since native III-nitride substrates are generally expensive and not widely available, III-nitride devices are often grown on sapphire or SiC substrates. Such non-III-nitride substrates are less than optimal for several reasons.

First, sapphire and SiC have different lattice constants than the III-nitride layers grown on them, causing strain and crystal defects in the III-nitride device layers, which can cause poor performance and reliability problems.

Second, in some devices it is desirable to remove the growth substrate, for example to improve the optical properties of the device or to gain electrical access to semiconductor layers grown on the growth substrate. In the case of a sapphire substrate, the growth substrate is often removed by laser dissociation of the III-nitride material, typically GaN, at the interface between the sapphire and the semiconductor layers. Laser dissociation generates shocks waves in the semiconductor layers which can damage the semiconductor or contact layers, potentially degrading the performance of the device. Other substrates may be removed by other techniques such as etching.

SUMMARY

In accordance with embodiments of the invention, a substrate including a host and a seed layer bonded to the host is provided, then a semiconductor structure including a light emitting layer disposed between an n-type region and a p-type region is grown on the seed layer. In some embodiments, a bonding layer bonds the host to the seed layer. In some embodiments, the seed layer may be thinner than a critical thickness for relaxation of strain in the semiconductor structure, such that strain in the semiconductor structure is relieved by dislocations formed in the seed layer, or by gliding between the seed layer and bonding layer at the interface between these layers. In some embodiments, the difference between the lattice constant of the seed layer and the lattice constant of a nucleation layer in the semiconductor structure is less than 1%. In some embodiments, the coefficient of thermal expansion of the host is at least 90% of the coefficient of thermal expansion of at least one layer of the semiconductor structure. In some embodiments, trenches are formed in the seed layer to reduce strain in the semiconductor structure. In some embodiments, the host may be separated from the semiconductor structure and seed layer by etching away the bonding layer with an etch that preferentially attacks the bonding layer over the semiconductor structure.

DETAILED DESCRIPTION

Figure 1:
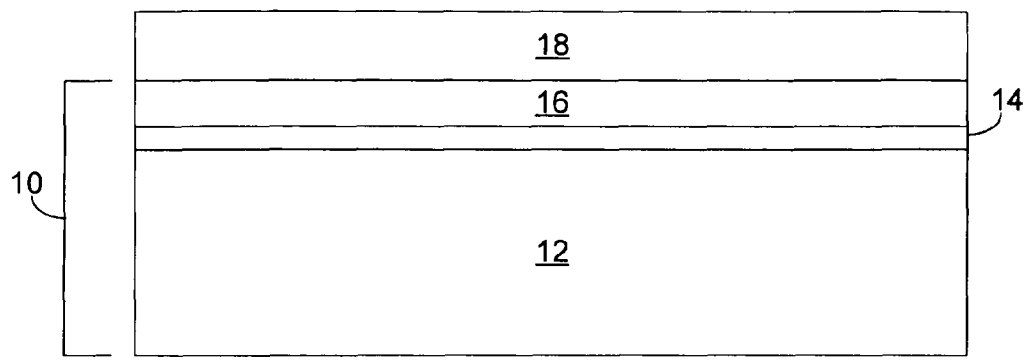
FIG. 1 illustrates a III-nitride semiconductor structure grown on a composite growth substrate including a host substrate, a bonding layer, and a seed layer.

In accordance with embodiments of the invention, a semiconductor light emitting device such as a III-nitride light emitting device is grown on a composite growth substrate 10, as illustrated in FIG. 1. Substrate 10 includes a host substrate 12, a seed layer 16, and a bonding layer 14 that bonds host 12 to seed 16. Each of the layers in substrate 10 are formed from materials that can withstand the processing conditions required to grow the semiconductor layers in the device. For example, in the case of a III-nitride device grown by MOCVD, each of the layers in substrate 10 must be able to tolerate an $H_2$ ambient at temperatures in excess of 1000° C.; in the case of a III-nitride device grown by MBE, each of the layers in substrate 10 must be able to tolerate temperatures in excess of 600° C. in a vacuum.

Host substrate 12 provides mechanical support to substrate 10 and to the semiconductor device layers 18 grown over substrate 10. Host substrate 12 is generally between 3 and 500 microns thick and is often thicker than 100 microns. In embodiments where host substrate 12 remains part of the device, host substrate 12 may be at least partially transparent if light is extracted from the device through host substrate 12. Host substrate 12 generally does not need to be a single crystal material since device layers 18 are not grown directly on host substrate 12. In some embodiments, the material of host substrate 12 is selected to have a coefficient of thermal expansion (CTE) that matches the CTE of device layers 18 and the CTE of seed layer 16. Any material able to withstand the processing conditions of epitaxial layers 18 may be suitable in embodiments of the invention, including semiconductors, ceramics, and metals. Materials such as GaAs which have a CTE desirably close to the CTE of device layers 18 but which decompose through sublimation at the temperatures required to grow III-nitride layers by MOCVD may be used with an impermeable cap layer such as silicon nitride deposited between the GaAs host and seed layer 16. Table 1 illustrates the CTE of III-nitride material and the CTE of some suitable host substrate materials:

TABLE 1

Coefficient of Thermal Expansion For Host Substrate Materials

| Material | CTE (° C.$^{-1}$) |
| --- | --- |
| III-nitride | $5.6 \times 10^{-6}$ |
| Single Crystal Al$_2$O$_3$ | $8.6 \times 10^{-6}$ |
| Polycrystalline Al$_2$O$_3$ | $8 \times 10^{-6}$ |
| Sintered AlN | $5.4 \times 10^{-6}$ |
| Si | $3.9 \times 10^{-6}$ |
| SiC | $4.2 \times 10^{-6}$ |
| GaAs | $5.4 \times 10^{-6}$ |
| Single Crystal Y$_3$Al$_5$O$_{12}$ | $6.9 \times 10^{-6}$ |
| Ceramic Y$_3$Al$_5$O$_{12}$ | $6.9 \times 10^{-6}$ |
| Metals such as Mo | Varies |

Seed layer 16 is the layer on which device layers 18 are grown, thus it must be a material on which III-nitride crystal can nucleate. Seed layer 16 may be between about 50 Å and 1 µm thick. In some embodiments seed layer 16 is CTE-matched to the material of device layers 18. Seed layer 16 is generally a single crystal material that is a reasonably close lattice-match to device layers 18. Often the crystallographic orientation of the top surface of seed layer 16 on which device layers 18 are grown is the wurtzite [0001] c-axis. In embodiments where seed layer 16 remains part of the finished device, seed layer 16 may be transparent or thin if light is extracted from the device through seed layer 16. Table 2 illustrates the a lattice constant of some seed layer materials:

TABLE 2

Lattice Constant For Seed Layer Materials

| Material | Lattice Constant (Å) |
| --- | --- |
| GaN | 3.19 |
| 4HSiC | 3.08 |
| 6HSiC | 3.08 |
| ScMgAlO$_4$ | 3.24 |
| ZnO | 3.25 |
| Al$_2$O$_3$ | 4.79 |
| AlGaN | Varies, 3.11-3.19 |
| InGaN | Varies, 3.19-3.53 |

One or more bonding layers 14 bond host substrate 12 to seed layer 16. Bonding layer 14 may be between about 100 Å and 1 µm thick. Examples of suitable bonding layers including SiO$_x$ such as SiO$_2$, SiN$_x$ such as Si$_3$N$_4$, HfO$_2$, mixtures thereof, metals such as Mo, Ti, TiN, other alloys, and other semiconductors or dielectrics. Since bonding layer 14 connects host substrate 12 to seed layer 16, the material forming bonding layer 14 is selected to provide good adhesion between host 12 and seed 16. In some embodiments, bonding layer 14 is a release layer formed of a material that can be etched by an etch that does not attack device layers 18, thereby releasing device layers 18 and seed layer 16 from host substrate 12. For example, bonding layer 14 may be SiO$_2$ which may be wet-etched by HF without causing damage to III-nitride device layers 18. In embodiments where bonding layer 14 remains part of the finished device, bonding layer 14 is preferably transparent or very thin. In some embodiments, bonding layer 14 may be omitted, and seed layer 16 may be adhered directly to host substrate 12.

Device layers 18 are conventional III-nitride device layers grown by growth techniques known in the art. The composition of the layer adjacent to seed layer 16 may be chosen for its lattice constant or other properties, and/or for its ability to nucleate on the material of seed layer 16.

In some embodiments of the invention, seed layer 16 and bonding layer 14 are thick layers that expand and contract with host substrate 12. For example, both bonding layer 14 and seed layer 16 may be thicker than 100 Å. Epitaxial layers 18 grown over seed layer 16 are strained due to the lattice-mismatch between epitaxial layers 18 and seed layer 16, thus to limit strain the composition of seed layer is chosen to be reasonably lattice-matched to epitaxial layers 18. In addition, the composition of seed layer 16 and host substrate 12 are selected to have CTEs that are close to the CTE of epitaxial layers 18. In some embodiments, the host substrate and seed layer materials are selected such that the CTE of the host is at least 90% of the CTE of at least one of the device layers, such as the light emitting layer. Examples of possible seed layer/bonding layer/host substrate combinations include Al$_2$O$_3$/oxide/Al$_2$O$_3$ or alumina; SiC/oxide/any host with a reasonably close CTE; ZnO/oxide/any host with a reasonably close CTE; and a III-nitride material such as GaN/oxide/any host with a reasonably close CTE.

If the CTE of host substrate 12 is greater than that of epitaxial layers 18, epitaxial layers 18 are under compressive strain at room temperature. The compressive strain in epitaxial layers 18 permits the growth of n-type layers of high Si doping, and permits the growth of a thick, for example, greater than 2 µm, epitaxial region 18. In contrast, if the CTE of host substrate 12 is less than that of epitaxial layers 18, epitaxial layers 18 are under tensile strain at room temperature, such that the thickness of and doping levels within epitaxial layers 18 are limited by cracking. Accordingly, the composition of host substrate 12 is generally selected to have a CTE greater than that of epitaxial layers 18.

In some embodiments of the invention, strain relief in the epitaxial layers 18 grown over composite substrate 10 is provided by limiting the thickness of seed layer 16 to less than or about equal to the critical thickness of epitaxial layers 18, i.e. the thickness at which epitaxial layers 18 relax and are no longer strained. For example, in a composite substrate with a sapphire or other host substrate 12 and a SiC seed layer 16, the thickness of seed layer 16 may be between 50 and 300 Å.

During growth of epitaxial layers 18, as the thickness of layers 18 increases over the thickness of a thin seed layer, the strain burden within epitaxial layers 18 due to growth on lattice-mismatched seed layer 16 is transferred from layers 18 to seed layer 16. Once the thickness of layer 18 exceeds the critical point for relaxation, relief of the strain within layers 18 is provided by dislocations formed within the seed layer 16, and by gliding between a compliant bonding layer 14 and seed layer 16, rather than by dislocations propagating upward through epitaxial layers 18. When the strain burden transfers from epitaxial layers 18 to seed layer 16 by the formation of dislocations in the seed layer, the lattice constant of the seed layer may shift from the lattice constant of the seed layer when relaxed and free standing to a lattice constant that is close to or identical to the lattice constant in the epitaxial layers. Epitaxial layers 18 are thus high quality layers largely free of dislocations. For example, concentration of threading dislocations in device layers 18 may be limited to less than $10^9 \text{ cm}^{-2}$, more preferably limited to less than $10^8 \text{ cm}^{-2}$, more preferably limited to less than $10^7 \text{ cm}^{-2}$, and more preferably limited to less than $10^6 \text{ cm}^{-2}$.

As described above, the composition of the III-nitride layer adjacent to seed layer 16 is generally chosen for its ability to nucleate on the material of seed layer 16. In the above example of this embodiment, where a SiC seed layer 16 is attached to a sapphire host substrate 12, the III-nitride layer grown on seed layer 16 may be AlN, which nucleates well on SiC and has a lattice constant reasonably close to that of SiC. The composition of epitaxial layers 18 may be shifted through the thickness of layers 18 by compositional grading or superlattices of any combination of III-nitride layers. For example, a very thin layer of AlN may be deposited directly on a SiC seed layer 16, then GaN may be added to form AlGaN of decreasing AlN composition, until the AlN composition reaches 0%, resulting in GaN. The composition may be shifted from GaN to InGaN by then adding and increasing the composition of InN until the desired composition of InGaN is reached.

As the thickness of seed layer decreases in this embodiment, the match between the CTEs of seed layer 16, host substrate 12, and epitaxial layers 18, and the match between the lattice constants of seed layer 16 and epitaxial layers 18 become less important, as a thin seed layer is better able to expand, form dislocations, or glide at the interface with bonding layer 14 to relieve strain in epitaxial layers 18.

In some embodiments, the materials for seed layer 16 and the first epitaxial layer 18 grown over the seed layer are selected such that the difference between the lattice constant of seed layer 16 and the lattice constant of the first epitaxial layer grown on the seed layer, referred to as the nucleation layer, is less than 1%. For example, a GaN or InGaN nucleation layer may be grown on a composite growth substrate including a ZnO seed layer 16 bonded by an oxide bonding layer to any host substrate with a reasonably close CTE to the CTE of the ZnO seed. The lattice constant of the ZnO is 3.24. The lattice constant of the nucleation layer may be between, for example, 3.21 and 3.27, depending on the InN composition of the nucleation layer. For example, an $In_{0.09}Ga_{0.91}N$ nucleation layer has a lattice constant of about 3.21, and an $In_{0.16}Ga_{0.84}N$ nucleation layer has a lattice constant of about 3.24. Since ZnO may dissociate at the temperatures required to grown InGaN by MOCVD, the first III-nitride layer grown on a composite substrate with a ZnO seed layer may be grown by a lower temperature technique such as MBE. Alternatively, an AlN nucleation layer, which has a lattice constant of 3.11, may be grown on a SiC seed layer, which has a lattice constant of 3.08.

Limiting the difference between the lattice constants of the seed layer and the nucleation layer may reduce the amount of strain in the device, potentially reducing the number of dislocations formed in epitaxial layers 18 of the device. In some devices, the lattice constant in epitaxial layers 18 such as the nucleation layer may be greater than the lattice constant in seed layer 16 so the epitaxial layers are under compressive strain, not tensile strain.

In some embodiments, the host substrate material is selected to have a CTE that causes the lattice constant of the seed layer to stretch a desired amount upon heating, in order to more closely match the lattice constant of epitaxial layers 18. Host substrate 12 may be selected such that its CTE results in tensile strain within seed layer 16 at the growth temperature of the III-nitride layers 18. Seed layer 16's lattice constant is thus expanded by the tensile strain to better match the lattice constant of the high InN compositions (for example, $In_{0.15}Ga_{0.85}N$) necessary for the light emitting layers of epitaxial layers 18 to emit visible light. Expanded seed layer lattice constants may be possible in a composite substrate with a SiC seed layer 16 on a sapphire host substrate 12, or a GaN seed layer 16 on a polycrystalline SiC host substrate 12. Where tensile strain is applied to seed layer 16 by host substrate 12, the thinner seed layer 16, the more seed layer 16 can tolerate the tensile strain without cracking. In general, it is desirable to limit the difference between the lattice constant of seed layer 16 and the lattice constant of the nucleation layer to less than about 1%, in particular in cases where the stretched lattice constant of the seed layer is intended to match the lattice constant of the nucleation layer.

In one example of an embodiment where the host substrate material is selected to stretch the lattice constant of the seed layer, an AlN nucleation layer, which has a CTE of about $5 \times 10^{-6} \text{ °C.}^{-1}$ and a lattice constant of 3.11, is grown on a substrate with a SiC seed layer 16, which has a CTE of about $4 \times 10^{-6} \text{ °C.}^{-1}$ and a lattice constant of 3.08. Host substrate 12 may have a CTE of at least $10 \times 10^{-6} \text{ °C.}^{-1}$. If host substrate 12 has a CTE of at least $15 \times 10^{-6} \text{ °C.}^{-1}$, expansion of host substrate 12 as the ambient temperature is raised to a temperature suitable for growth of epitaxial layers 18 (for example, about 1000° C.) will cause the lattice constant of SiC seed layer 16 to expand to match the lattice constant of the grown AlN nucleation layer. Since there is no lattice constant mismatch between seed layer 16 and the nucleation layer, the AlN nucleation layer may be grown dislocation free or with a very low concentration of dislocations. One example of a suitable host substrate material with a CTE of at least $15 \times 10^{-6} \text{ °C.}^{-1}$ is Haynes Alloy 214, UNS # N07214, which is an alloy of 75% Ni, 16% Cr, 4.5% Al, and 3% Fe with a CTE of $18.6 \times 10^{-6} \text{ °C.}^{-1}$, and a melting point of 1355° C. In another example, an AlGaN nucleation layer with up to 50% AlN is grown on a substrate with an AlN seed layer 16. In another example, an InGaN nucleation layer is grown on a substrate with a GaN seed layer 16. Trenches may be formed on a wafer of devices to prevent dislocations from forming when the wafer is cooled to room temperature after growth and the lattice constant of seed layer 16 contracts again. Such trenches are described below in reference to FIG. 9.

Figure 9:
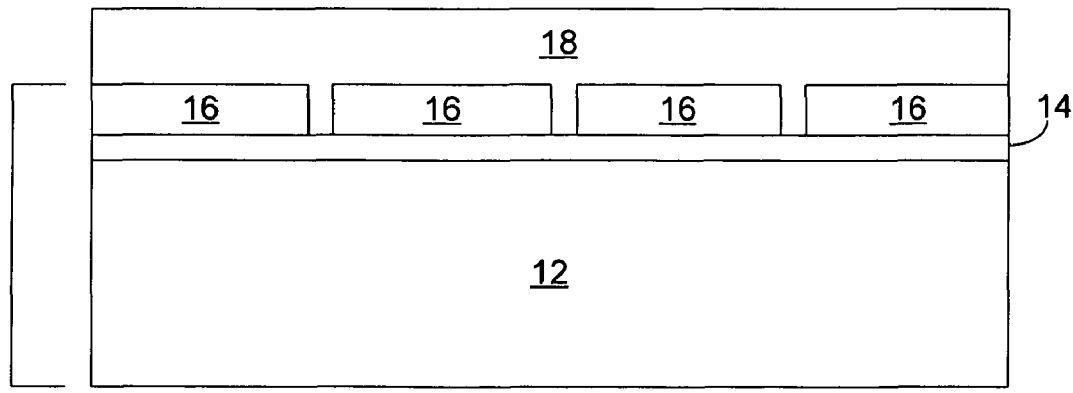
FIG. 9 illustrates a device with a composite substrate including a patterned seed layer.

In some embodiments, further strain relief in epitaxial layers 18 may be provided by forming the seed layer as stripes or a grid over bonding layer 14, rather than as a single uninterrupted layer. Alternatively, seed layer may be formed as a single uninterrupted layer, then removed in places, for example by forming trenches, to provide strain relief. FIG. 9 is a cross sectional view of a device with a composite substrate including a seed layer 16 formed as stripes. A single uninterrupted seed layer 16 may be attached to host substrate 12 through bonding layer 14, then patterned by conventional lithography techniques to remove portions of the seed layer to form stripes. The edges of each of the seed layer stripes may provide additional strain relief by concentrating dislocations within epitaxial layers 18 at the edges of the stripes of seed layer. The composition of seed layer 16, bonding layer 14, and the nucleation layer may be selected such that the nucleation layer material nucleates preferentially on seed layer 16, not on the portions of bonding layer 14 exposed by the spaces between the portions of seed layer 16.

On a wafer of light emitting devices, the trenches in seed layer 16 illustrated in FIG. 9 may be spaced on the order of a single device width, for example, hundred of microns or millimeters apart. A wafer of devices formed on a composite substrate with a patterned seed layer may be divided such that the edges of the seed layer portions are not located beneath the light emitting layer of individual devices, since the dislocations concentrated at the edge of the seed layers may cause poor performance or reliability problems. Alternatively, multiple trenches may be formed within the width of a single device, for example, spaced on the order of microns or tens of microns apart. Growth conditions on such substrates may be selected such that the nucleation layer formed over seed layer 16, or a later epitaxial layer, coalesces over the trenches formed in seed layer 16, such that the light emitting layer of the devices on the wafer is formed as a continuous layer uninterrupted by the trenches in seed layer 16.

Figure 4:
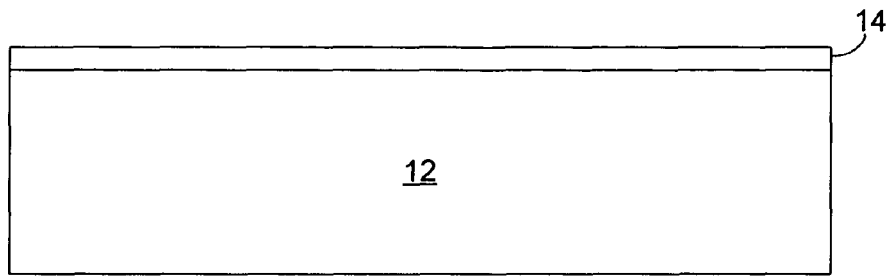
FIG. 4 illustrates a host substrate and bonding layer.
Figure 5:
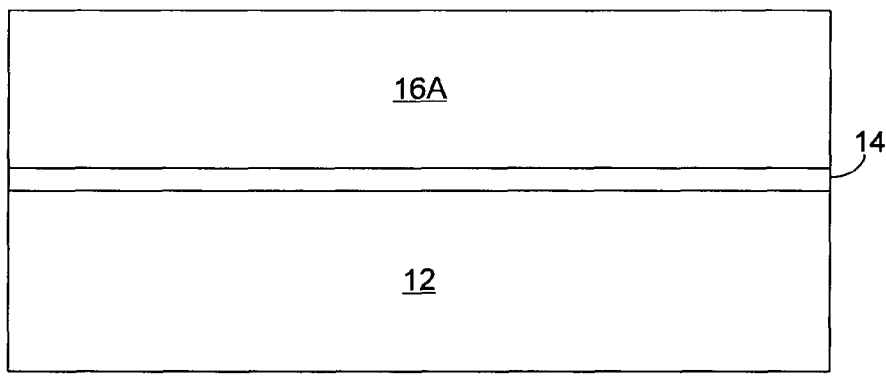
FIG. 5 illustrates the structure of FIG. 4 bonded to a thick wafer of seed layer material.
Figure 6:
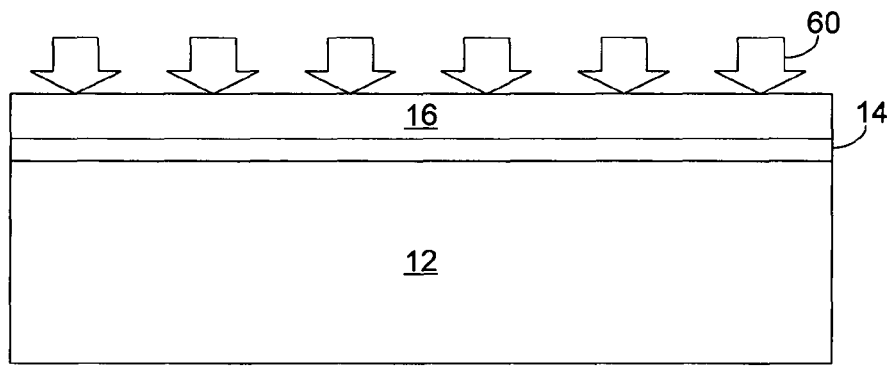
FIG. 6 illustrates a composite substrate after removing a portion of a thick wafer of seed layer material to leave a seed layer of desired thickness.

Some of the composite substrates described in the embodiments and examples above may be formed as illustrated in FIGS. 4-6. FIGS. 4-6 illustrate forming a composite substrate when bulk material for the seed layer is readily available; for example, substrates with seed layers of SiC, $Al_2O_3$, ZnO, and possibly some III-nitride layers such as AlN. As illustrated in FIG. 4, bonding layer 14 is formed on a host substrate 12 by a conventional technique suitable to the bonding layer and the host substrate material. For example, a $SiO_2$ bonding layer 14 may be deposited on an $Al_2O_3$ host substrate 12 by, for example, a deposition technique such as chemical vapor deposition. In some embodiments, bonding layer 14 may be treated after deposit by a technique to make bonding layer 14 flat, such as for example mechanical polishing.

A thick wafer of seed layer material 16A is then bonded to the exposed surface of bonding layer 14, as illustrated in FIG. 5. Seed layer material wafer 16A must also be flat in order to form a strong bond to bonding layer 14. Host substrate 12 and wafer 16A are bonded at elevated temperature and pressure.

The portion of seed layer material 16A beyond the desired thickness of seed layer 16 is then removed by a technique 60 appropriate to the composition of seed layer 16 as illustrated in FIG. 6. For example, $Al_2O_3$ seed layer material may be removed by grinding and SiC seed layer material may be removed by etching. The resulting structure is the composite substrate 10 described above.

Figure 7:
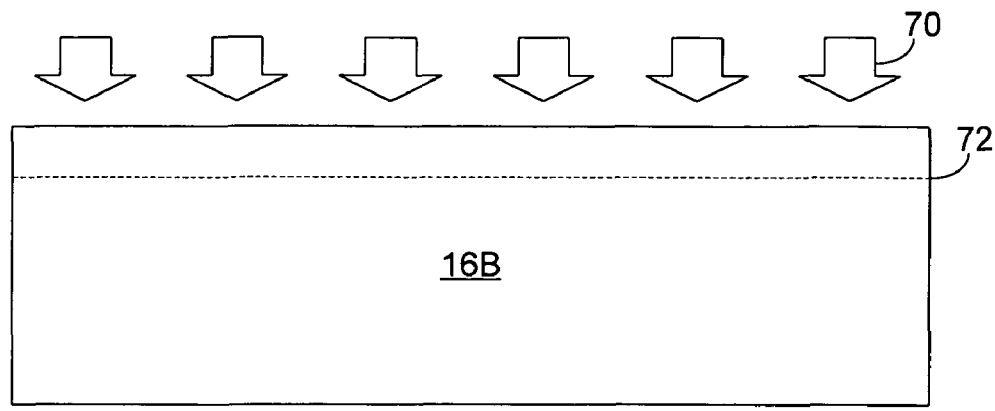
FIG. 7 illustrates implanting a bubble layer in a thick wafer of seed layer material.
Figure 8:
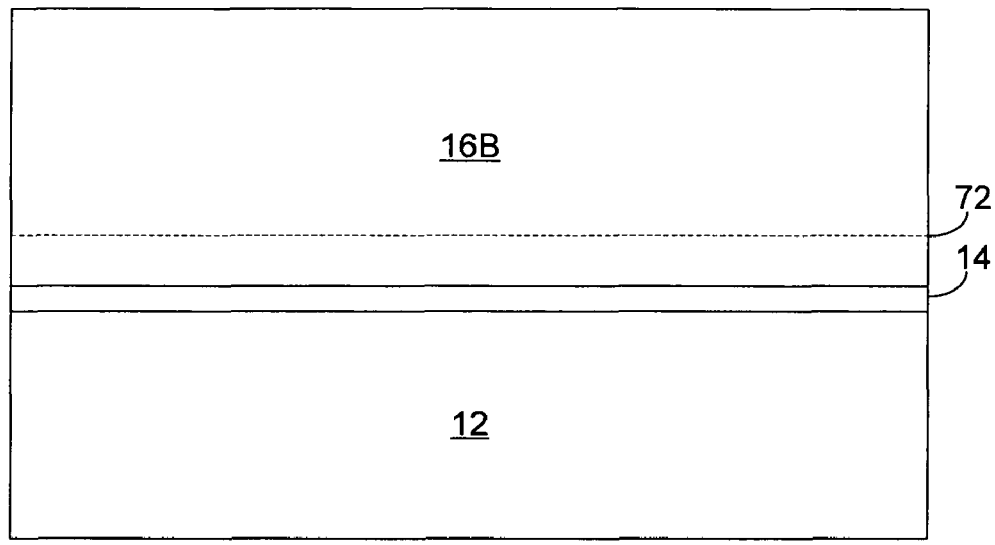
FIG. 8 illustrates the structure of FIG. 7 bonded to the structure of FIG. 4.

FIGS. 4, 7, and 8 illustrate an alternative method for forming the composite substrates described above. As in the method described above in reference to FIGS. 4-6, a bonding layer 14 is first formed on host substrate 12, then processed if necessary to make bonding layer 14 flat, as illustrated in FIG. 4.

Separately, a wafer of seed layer material 16B is implanted 70 with a material 72 such as hydrogen, deuterium, or helium to form a bubble layer at a depth 72 corresponding to the desired thickness of seed layer 16 in the final composite substrate. Seed layer material wafer 16B may be a single material, such as $Al_2O_3$, or it may include different materials, such as a III-nitride layer grown epitaxially on an $Al_2O_3$ wafer or bonded to a host substrate, as described below.

Wafer 16B is bonded to bonding layer 14, such that the side of wafer 16B implanted with hydrogen is bonded to bonding layer 14. As described above in reference to FIG. 5, both the exposed surface of bonding layer 14 and the surface of wafer 16B must be sufficiently flat to form a strong bond at elevated temperature and pressure. The resulting structure is illustrated in FIG. 8. The bonded structure of FIG. 8 is then heated for example to a temperature greater than about 500° C. in an inert atmosphere, which heating causes the bubble layer implanted in wafer 16B to expand, delaminating the thin seed layer portion of wafer 16B from the rest of wafer 16B at the thickness where bubble layer 72 was implanted, resulting in a finished composite substrate 10 as described above.

In the embodiments and examples above that include seed layers of materials that are not readily available as bulk material, the seed layer must be prepared separately, for example, in the case of III-nitride seed layers such as GaN, AlGaN, InGaN, InN, and AlN, grown on a suitable growth substrate such as sapphire by an epitaxial technique such as MOCVD or MBE. After growth of seed layer material of appropriate thickness on a growth substrate, the seed layer may be attached to an appropriate host and the growth substrate removed by a technique appropriate to the growth substrate.

In some embodiments, such as III-nitride seed layer materials, the seed layer is grown strained on the growth substrate. When the seed layer 16 is connected to host substrate 12 and released from the growth substrate, if the connection between seed layer 16 and host substrate 16 is compliant, for example a compliant bonding layer 14, seed layer 16 may at least partially relax. Thus, though the seed layer is grown as a strained layer, the composition may be selected such that the lattice constant of the seed layer, after the seed layer is released from the growth substrate and relaxes, is reasonably close or matched to the lattice constant of the epitaxial layers 18 grown over the seed layer.

For example, when a III-nitride device is conventionally grown on $Al_2O_3$, the first layer grown on the substrate is generally a GaN buffer layer with an a lattice constant of about 3.19. The GaN buffer layer sets the lattice constant for all of the device layers grown over the buffer layer, including the light emitting layer which is often InGaN. Since relaxed, free standing InGaN has a larger a lattice constant than GaN, the light emitting layer is strained when grown over a GaN buffer layer. In contrast, in embodiments of the invention, an InGaN seed layer may be grown strained on a conventional substrate, then bonded to a host and released from the growth substrate such that the InGaN seed layer at least partially relaxes. After relaxing, the InGaN seed layer has a larger a lattice constant than GaN. As such, the lattice constant of the InGaN seed layer is a closer match than GaN to the lattice constant of a relaxed free standing layer of the same composition as the InGaN light emitting layer. The device layers grown over the InGaN seed layer, including the InGaN light emitting layer, will replicate the lattice constant of the InGaN seed layer. Accordingly, an InGaN light emitting layer with a relaxed InGaN seed layer lattice constant is less strained than an InGaN light emitting layer with a GaN buffer layer lattice constant. Reducing the strain in the light emitting layer may improve the performance of the device.

For example, a GaN buffer layer grown conventionally on sapphire may have a lattice constant of 3.189 Å. An InGaN layer that emits blue light may have the composition $In_{0.12}Ga_{0.88}N$, a composition with a free standing lattice constant of 3.23 Å. The strain in the light emitting layer is the difference between the actual lattice constant in the light emitting layer (3.189 Å for layer grown on a conventional GaN buffer layer) and the lattice constant of a free standing layer of the same composition, thus strain may be expressed as $(a_{freestanding}-a_{actual})/a_{freestanding}$. In the case of a conventional $In_{0.12}Ga_{0.88}N$ layer, the strain is (3.23 Å–3.189 Å)/3.23 Å, about 1.23%. If a light emitting layer of the same composition is gown on a composite substrate with an InGaN seed layer, the strain may be reduced or eliminated, because the larger lattice constant of the InGaN seed layer results in a larger actual lattice constant in the light emitting layer. In some embodiments of the invention, the strain in the light emitting layer of a device emitting light between 430 and 480 nm may be reduced to less than 1%, and more preferably to less than 0.5%. An InGaN layer that emits cyan light may have the composition $In_{0.16}Ga_{0.84}N$, a composition with strain of about 1.7% when grown on a conventional GaN buffer layer. In some embodiments of the invention, the strain in the light emitting layer of a device emitting light between 480 and 520 nm may be reduced to less than 1.5%, and more preferably to less than 1%. An InGaN layer that emits green light may have the composition $In_{0.2}Ga_{0.8}N$, a composition with a free standing lattice constant of 3.26 Å, resulting in strain of about 2.1% when grown on a conventional GaN buffer layer. In some embodiments of the invention, the strain in the light emitting layer of a device emitting light between 520 and 560 nm may be reduced to less than 2%, and more preferably to less than 1.5%.

Figure 11:
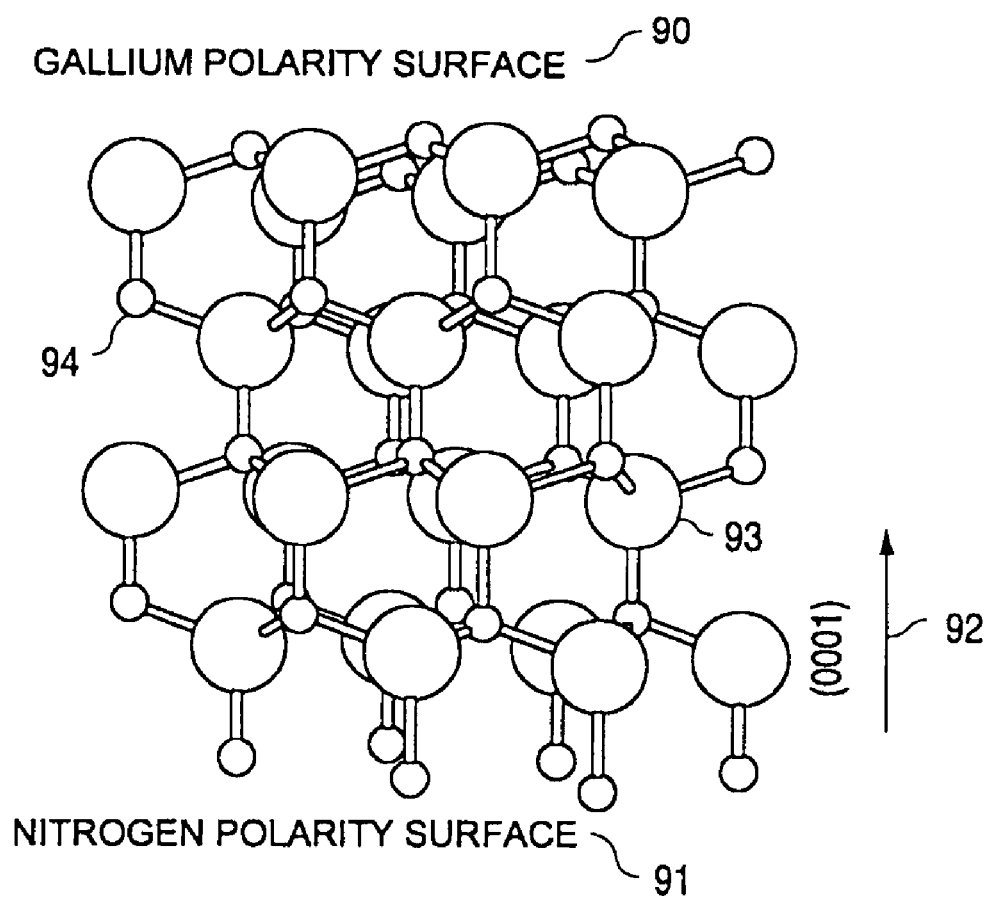
FIG. 11 illustrates a unit cell of wurtzite GaN.

III-nitride seed layer materials may require additional bonding steps in order to form a composite substrate with a III-nitride seed layer in a desired orientation. III-nitride layers grown on sapphire or SiC growth substrates are typically grown as c-plane wurtzite. FIG. 11 illustrates a unit cell of wurtzite GaN, formed from gallium atoms 93 and nitrogen atoms 94. Such wurtzite III-nitride structures have a gallium polarity 90 and a nitrogen polarity 91. III-nitrides preferentially grow such that the top surface of the grown layer is the gallium polarity 90, while the bottom surface (the surface adjacent to the growth substrate) is the nitrogen polarity 91. Simply growing seed layer material conventionally on sapphire or SiC then connecting the seed layer material to a host and removing the growth substrate would result in a composite substrate with a III-nitride seed layer with the nitrogen polarity 91 exposed. As described above, III-nitrides preferentially grow on the gallium polarity, i.e. with the gallium polarity as the top surface, thus growth on the nitrogen polarity may undesirably introduce defects into the crystal, or result in poor quality material as the crystal orientation switches from an orientation with the nitrogen polarity as the top surface to an orientation with the gallium polarity as the top surface.

To form a composite substrate with a III-nitride seed layer with the gallium face as the top surface, seed layer material may be grown conventionally on a growth substrate, then bonded to any suitable first host substrate, then separated from the growth substrate, such that the seed layer material is bonded to the first host substrate through the gallium face, leaving the nitrogen face exposed by removal of the growth substrate. The nitrogen face of the seed layer material is then bonded to a second host substrate 10, the host substrate of the composite substrate according to embodiments of the invention. After bonding to the second host substrate, the first host substrate is removed by a technique appropriate to the growth substrate. In the final composite substrate, the nitrogen face of the seed layer material 16 is bonded to host substrate 12 (the second host substrate) through optional bonding layer 14, such that the gallium face of III-nitride seed layer 16 is exposed for growth of epitaxial layers 18.

For example, a GaN buffer layer is conventionally grown on a sapphire substrate, followed by an InGaN layer which will form the seed layer of a composite substrate. The InGaN layer is bonded to a first host substrate with or without a bonding layer. The sapphire growth substrate is removed by laser melting of the GaN buffer layer adjacent to the sapphire, then the remaining GaN buffer layer exposed by removing the sapphire is removed by etching, resulting in an InGaN layer bonded to a first host substrate. The InGaN layer may be implanted with a material such as hydrogen, deuterium, or helium to form a bubble layer at a depth corresponding to the desired thickness of the seed layer in the final composite substrate, as described above in reference to FIG. 7. The InGaN layer may optionally be processed to form a surface sufficiently flat for bonding. The InGaN layer is then bonded with or without a bonding layer to a second host substrate, which will form the host in the final composite substrate. The first host substrate, InGaN layer, and second host substrate are then heated as described above, causing the bubble layer implanted in the InGaN layer to expand, delaminating the thin seed layer portion of the InGaN layer from the rest of the InGaN layer and the first host substrate, resulting in a finished composite substrate as described above with an InGaN seed layer bonded to a host substrate.

As an alternative to bonding the seed layer material twice, to a first host substrate then to a second host substrate in order to twice flip the crystal orientation of the seed layer material, the seed layer material may be grown on a growth substrate with the nitrogen polarity up. When the nitrogen polarity seed layer material is connected to host substrate 12 as described above, the gallium polarity of seed layer 16 is exposed for growth of epitaxial layers 18. Nitrogen polarity films may be grown by, for example, vapor phase epitaxy or MOCVD, as described in more detail in "Morphological and structure characteristics of homoepitaxial GaN grown by metalorganic chemical vapour deposition (MOCVD)," Journal of Crystal Growth 204 (1999) 419-428 and "Playing with Polarity", Phys. Stat. Sol. (b) 228, No. 2, 505-512 (2001), both of which are incorporated herein by reference.

"Morphological and structure characteristics of homoepitaxial GaN grown by metalorganic chemical vapour deposition (MOCVD)," Journal of Crystal Growth 204 (1999) 419-428 recites at page 420, second column, "[t]he GaN crystals used as substrates for epitaxy in this study were grown under a high-hydrostatic pressure of nitrogen (15-20 kbar) from liquid gallium at a temperature of 1600° C. [17]. Both sides of the {0 0 0 1} oriented plate-like crystals were mechanically polished using 0.1 µm grade diamond paste, while the (000$\bar{1}$) N-faces . . . were subsequently mechano-chemically polished in an aqueous solution of KOH following the procedure described in Ref. [21]. Undoped epitaxial GaN layers were grown in a horizontal reactor by the metalorganic chemical vapour deposition (MOCVD) method. The crystals were heated up to the growth temperature of 1050° C. under a $N_2/NH_3$ atmosphere. Epitaxial growth was performed using trimethylgallium (TMG) and $NH_3$ precursors with $H_2$ as the carrier gas, under a total pressure of 50 mbar. The TMG flow rate was about 60 µmol/min and the $NH_3$ flow was 2.5 standard liter/min (slm), diluted with $H_2$ to a total flow of 5 slm. The time of epitaxial growth was 1 h . . . ."

"Playing with Polarity", Phys. Stat. Sol. (b) 228, No. 2, 505-512 (2001) recites at page 507 lines 1-13 several methods for growing nitrogen polarity films: "The most obvious approach is to use the two sides of opposite polarity of a free-standing III-nitride sample e.g. obtained by high pressure—high temperature synthesis [4] or by laser-induced lift-off from a heterosubstrate [5]. A second approach is the use of polar substrates such as ZnO or 6H—SiC, which can be prepared as bulk crystals with defined polarity and thus can set the polarity of heteroepitaxially grown III-nitride layers accordingly. . . . High quality III-nitride MOCVD-layers on sapphire invariantly turn out to have Ga-face polarity, whereas similar layers grown by MBE exhibit N-face polarity . . . [when grown u]nder deposition conditions typical for MBE growth (substrate temperatures around 850° C., low flux of nitrogen radicals towards the substrate."

In some embodiments, the seed layer material is grown as m-plane or a-plane material, rather than as c-plane material as described above.

Figure 2:
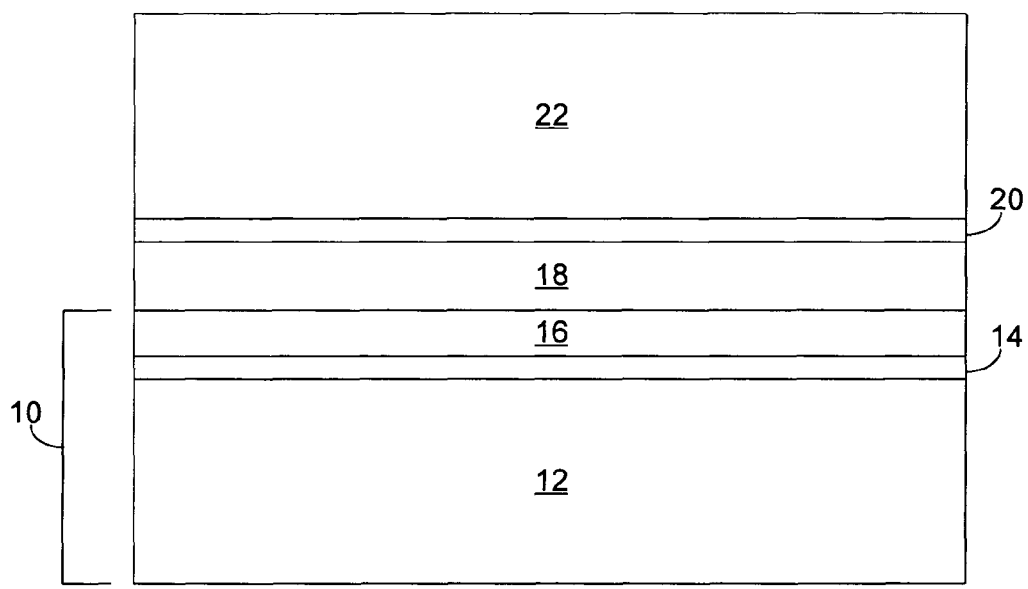
FIG. 2 illustrates the structure of FIG. 1 bonded to a second host substrate.
Figure 3:
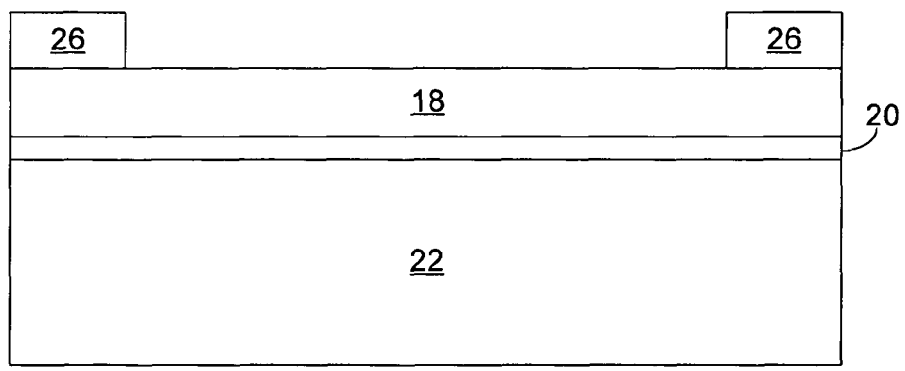
FIG. 3 illustrates the structure of FIG. 2 after removal of the seed layer, the bonding layer and the first host substrate, and after forming a contact on the exposed surface of the epitaxial layers.

A III-nitride device grown on a composite substrate 10 according to any of the above-described embodiments may be processed into a thin film device as illustrated in FIGS. 1-3. As described above, device layers 18 are grown on a composite substrate 10. The device layers are then bonded to a new host substrate, then all or a portion of composite substrate 10 may be removed. FIG. 1 illustrates the device layers grown on composite substrate 10. Device layers 18 typically include an n-type region grown over substrate 10, which may include optional preparation layers such as buffer layers or nucleation layers, and optional release layers designed to facilitate release of composite substrate 10 or thinning of the epitaxial layers after removal of composite substrate 10. Over the n-type region, one or more light emitting layers are typically grown, followed by a p-type region. The top surface of device layers 18 may be processed to increase light extraction from the finished device, for example by roughening or by forming a structure such as a photonic crystal.

As illustrated in FIG. 2, one or more metal layers 20, including, for example, ohmic contact layers, reflective layers, barrier layers, and bonding layers, are deposited over the top surface of device layers 18. The device layers are then bonded to a host substrate 22 via the exposed surface of metal layers 20. One or more bonding layers, typically metal, may serve as compliant materials for thermo-compression or eutectic bonding between the epitaxial device layers 18 and host substrate 22. Examples of suitable bonding layer metals include gold and silver. Host substrate 22 provides mechanical support to the epitaxial layers after the composite growth substrate 10 is removed, and provides electrical contact to one surface of device layers 18. Host substrate 22 is generally selected to be electrically conductive (i.e. less than about 0.1 Ωcm), to be thermally conductive, to have a CTE matched to that of the epitaxial layers, and to be flat enough (i.e. with an root mean square roughness less than about 10 nm) to form a strong wafer bond. Suitable materials include, for example, metals such as Cu, Mo, Cu/Mo, and Cu/W; semiconductors with metal contacts, such as Si with ohmic contacts and GaAs with ohmic contacts including, for example, one or more of Pd, Ge, Ti, Au, Ni, Ag; and ceramics such as AlN, compressed diamond, or diamond layers grown by chemical vapor deposition.

Device layers 18 may be bonded to host substrate 22 on a wafer scale, such that an entire wafer of devices are bonded to a wafer of hosts, then the individual devices are diced after bonding. Alternatively, a wafer of devices may be diced into individual devices, then each device bonded to host substrate 22 on a die scale, as described in more detail in U.S. application Ser. No. 10/977,294, "Package-Integrated Thin-Film LED," filed Oct. 28, 2004, and incorporated herein by reference.

Host substrate 22 and epitaxial layers 18 are pressed together at elevated temperature and pressure to form a durable bond at the interface between host substrate 22 and metal layers 20, for example a durable metal bond formed between metal bonding layers at the interface. The temperature and pressure ranges for bonding are limited on the lower end by the strength of the resulting bond, and on the higher end by the stability of the host substrate structure, metallization, and the epitaxial structure. For example, high temperatures and/or high pressures can cause decomposition of the epitaxial layers, delamination of metal contacts, failure of diffusion barriers, or outgassing of the component materials in the epitaxial layers. A suitable temperature range for bonding is, for example, room temperature to about 500° C. A suitable pressure range for bonding is, for example, no pressure applied to about 500 psi.

All or a portion of composite substrate 10 may then be removed, as illustrated in FIG. 3. For example, host substrate 12 of composite substrate 10 may be removed by etching the device in an etch that attacks bonding layer 14. Host substrate 12 and bonding layer 14 are thus removed, leaving seed layer 16 and device layers 18 bonded to second host substrate 22. Seed layer 16 may also be removed, such as by etching, lapping, grinding, or a combination thereof. For example, a SiC seed layer may be etched away and an $Al_2O_3$ seed layer may be ground away. In some embodiments seed layer 16 or the entire composite substrate 10 remains part of the finished device.

If the entire composite substrate 10 is removed as in the device illustrated in FIG. 3, the remaining device layers 18 may be thinned, for example to remove portions of the device layers closest to seed layer 16 and of low material quality. The epitaxial layers may be thinned by, for example, chemical mechanical polishing, conventional dry etching, or photoelectrochemical etching (PEC). The top surface of the epitaxial layers may be textured or roughened to increase the amount of light extracted. A contact 26, often an n-contact, is formed on the exposed surface of layers 18, for example in a ring or a grid. The device layers beneath the contact may be implanted with, for example, hydrogen to prevent light emission from the portion of the light emitting region beneath the contact. Wavelength converting layers such as phosphors and/or secondary optics such as dichroics or polarizers may be applied onto the emitting surface, as is known in the art.

Figure 10:
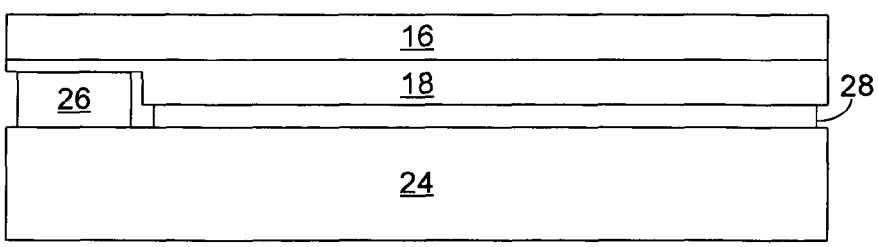
FIG. 10 illustrates a flip chip device grown on the seed layer of a composite substrate.

Alternatively, as illustrated in FIG. 10, a portion of epitaxial layers 18 of the device shown in FIG. 1 may be removed such that portions of both the n-type region and the p-type region sandwiching the light emitting region are exposed on the same side of the device. Electrical contacts 26 and 28 are formed on these exposed portions. If electrical contacts 26 and 28 are reflective, the structure may be mounted contacts-side-down on a mount 24 such that light is extracted through seed layer 16 as illustrated in FIG. 10. All or some of composite substrate may be removed, for example leaving seed layer 16 attached to epitaxial layers 18 as illustrated in FIG. 10. If electrical contacts 26 and/or 28 are transparent, the device may be mounted contacts-side-up such that light is extracted through contacts 26 and 28 (not shown in FIG. 10).

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method comprising:
   providing a substrate comprising:
      a host; and
      a seed layer comprising InGaN bonded to the host; and
   growing a semiconductor structure on the seed layer, the semiconductor structure comprising a III-nitride light emitting layer disposed between an n-type region and a p-type region, wherein during growth of the semiconductor structure, the seed layer is bonded to the host.

2. The method of claim 1 wherein the substrate further comprises a bonding layer disposed between the host and the seed layer.

3. The method of claim 2 wherein the bonding layer comprises one of an oxide of silicon and a nitride of silicon.

4. The method of claim 1 wherein a coefficient of thermal expansion of the host is at least 90% of a coefficient of thermal expansion of a layer of the semiconductor structure.

5. The method of claim 1 wherein a plurality of trenches are formed in the seed layer, wherein the trenches extend through an entire thickness of the seed layer.

6. The method of claim 5 wherein the plurality of trenches are spaced between 1 micron and 50 microns apart.

7. The method of claim 5 wherein the plurality of trenches are spaced between 50 microns and 2 millimeters apart.

8. The method of claim 5 wherein the substrate further comprises a bonding layer disposed between the host and the seed layer.

9. The method of claim 8 wherein the trenches extend through the seed layer to the bonding layer.

10. The method of claim 5 wherein the trenches extend through the seed layer to the host.

11. The method of claim 5 wherein the difference between a lattice constant of a relaxed, free standing layer having a same composition as the seed layer and a lattice constant of a portion of the semiconductor structure closest to the seed layer is 1% or less.

12. The method of claim 5 wherein the difference between a coefficient of thermal expansion of the seed layer and a coefficient of thermal expansion of the host causes a lattice constant of the seed layer to increase at a growth temperature of a portion of the semiconductor structure such that at a growth temperature, the difference between a lattice constant of the seed layer and a lattice constant of the portion of the semiconductor structure is 1% or less.

13. The method of claim 1 wherein:
the semiconductor structure further comprises a nucleation layer grown directly on the seed layer; and
the difference between a lattice constant of the seed layer and a lattice constant of the nucleation layer is 1% or less.

14. The method of claim 13 wherein the nucleation layer is InGaN.

15. A structure comprising:
a host substrate;
an InGaN seed layer; and
a bonding layer disposed between the InGaN seed layer and the host substrate;
wherein the InGaN seed layer comprises a surface on which III-nitride material can nucleate.

16. The structure of claim 15 wherein the bonding layer is $SiO_2$.

17. The structure of claim 15 wherein the host is sapphire.

18. The structure of claim 15 wherein the host is one of Si, SiC, AlN, GaAs, metal, and $Y_3Al_5O_{12}$.

19. A method comprising:
providing a substrate comprising:
a host; and
a seed layer bonded to the host; and
growing a semiconductor structure on the seed layer, the semiconductor structure comprising a III-nitride light emitting layer disposed between an n-type region and a p-type region, wherein during growth of the semiconductor structure, the seed layer is bonded to the host;
wherein:
a free standing layer of the same composition as the III-nitride light emitting layer has a lattice constant $a_{freestanding}$;
the III-nitride light emitting layer has a lattice constant $a_{actual}$; and
$(|a_{freestanding} - a_{actual}|)/a_{freestanding}$ is less than 1%.

20. The method of claim 19 wherein the seed layer is InGaN.

21. The method of claim 19 wherein the substrate further comprises a plurality of trenches formed in the seed layer.

* * * * *